(12) United States Patent  
Grötsch et al.

(10) Patent No.: US 7,837,371 B2  
(45) Date of Patent: *Nov. 23, 2010

(54) LIGHT SOURCE

(75) Inventors: Stefan Grötsch, Lengfeld/Bad Abbach (DE); Georg Bogner, Lappersdorf (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 2 days.

This patent is subject to a terminal disclaimer.

(21) Appl. No.: 12/343,433

(22) Filed: Dec. 23, 2008

(65) Prior Publication Data

US 2009/0109699 A1    Apr. 30, 2009

Related U.S. Application Data

(63) Continuation of application No. 10/834,761, filed on Apr. 28, 2004, now Pat. No. 7,467,885.

(30) Foreign Application Priority Data

Apr. 29, 2003    (DE)    ................................ 103 19 274

(51) Int. Cl.  
*F21V 7/04*    (2006.01)

(52) U.S. Cl. ........................... 362/555; 362/26; 362/231

(58) Field of Classification Search ................. 362/26, 362/616, 612, 606, 621, 554, 555, 556, 582, 362/293, 294, 231

See application file for complete search history.

(56) References Cited

U.S. PATENT DOCUMENTS 4,306,716 A  *  12/1981  James et al. ................... 463/31

(Continued)

FOREIGN PATENT DOCUMENTS

EP             0 322 106 A2       11/1988

(Continued)

OTHER PUBLICATIONS

Schnitzer et al. "30% external quantum efficiency from surface textured, thin-film light-emitting diodes", Applied Physics Letter vol. 63, No. 16; pp. 2174-2176, Oct. 18, 1993.*

(Continued)

*Primary Examiner*—Gunyoung T Lee  
(74) *Attorney, Agent, or Firm*—Cohen Pontani Lieberman & Pavane LLP

(57) ABSTRACT

A light source, such as for a projection system, having a plurality of semiconductor chips and at least two different, electromagnetic-radiation-emitting chip types with different emission spectra, each semiconductor chip having a chip coupling-out area through which radiation is coupled out. Furthermore, the light source has a plurality of primary optical elements, each semiconductor chip being assigned a primary optical element, which in each case has a light input and a light output and reduces the divergence of at least part of the radiation emitted by the semiconductor chip during the operation thereof. The semiconductor chips with the primary optical elements are arranged in at least two groups that are spatially separate from one another, with the result that the groups emit separate light cones during operation of the semiconductor chips. The separate light cones of the groups are superposed by means of a secondary optical arrangement to form a common light cone.

26 Claims, 7 Drawing Sheets

U.S. PATENT DOCUMENTS

| | | |
|---|---|---|
| 4,951,179 A | 8/1990 | Machida |
| 5,604,607 A | 2/1997 | Mirazaoff |
| 5,727,108 A | 3/1998 | Hed |
| 5,775,792 A | 7/1998 | Wiese |
| 5,810,469 A | 9/1998 | Weinreich |
| 5,813,752 A | 9/1998 | Singer et al. |
| 5,847,507 A | 12/1998 | Butterworth et al. |
| 5,966,393 A | 10/1999 | Hide et al. |
| 6,172,816 B1 | 1/2001 | Tadic-Galeb et al. |
| 6,220,722 B1 | 4/2001 | Begemann |
| 6,252,155 B1 | 6/2001 | Ortabasi |
| 6,318,863 B1 | 11/2001 | Tiao et al. |
| 6,499,860 B2 | 12/2002 | Begemann |
| 6,509,651 B1 | 1/2003 | Matsubara et al. |
| 6,527,411 B1 | 3/2003 | Sayers |
| 6,540,377 B1 | 4/2003 | Ota et al. |
| 6,814,470 B2 | 11/2004 | Rizkin et al. |
| 7,026,755 B2 | 4/2006 | Setlur et al. |
| 7,083,302 B2 | 8/2006 | Chen et al. |
| 2002/0030194 A1 | 3/2002 | Camras et al. |
| 2002/0080622 A1* | 6/2002 | Pashley et al. ............... 362/555 |
| 2002/0085279 A1 | 7/2002 | Chuang et al. |
| 2004/0141104 A1 | 7/2004 | Yu et al. |

FOREIGN PATENT DOCUMENTS

| | | |
|---|---|---|
| EP | 0 869 388 A1 | 9/1997 |
| EP | 0 985 952 A1 | 3/1999 |
| EP | 1 003 062 A1 | 6/1999 |
| EP | 985952 | 3/2000 |
| EP | 1 098 535 A1 | 10/2000 |
| JP | 1-143367 A | 6/1989 |
| JP | 9-265807 A | 10/1997 |
| WO | WO 98/20475 | 5/1998 |

OTHER PUBLICATIONS

Schnitzer et al., "303% external quantum efficiency from surface textured, thin-film light-emitting diodes", Applied Physics Letter vol. 63, No. 16; pp. 2174-2176, Oct. 18, 1993.

W.T. Welford et al., "High Collection Nonimaging Optics", Academic Press, Inc., 1989.

* cited by examiner

LIGHT SOURCE

RELATED APPLICATIONS

This patent application is a Continuation of U.S. patent application Ser. No. 10/834,761, filed Apr. 28, 2004, which issued as U.S. Pat. No. 7,467,885, Dec. 23, 2008, the entire content of which is incorporated herein by reference. Priority is claimed on German Application No. 10319274.3, filed Apr. 29, 2003, the disclosure content of which is hereby incorporated by reference.

FIELD OF THE INVENTION

The invention relates to a light source including a plurality of semiconductor chips and at least two different electromagnetic-radiation-emitting chip types having different emission spectra. The electromagnetic radiation of the chips is radiated in a common light cone and intermixed. The invention relates, in particular, to light sources of this type in which the semiconductor chips emit visible electromagnetic radiation.

BACKGROUND OF THE INVENTION

Most known light sources have incandescent lamps, arc lamps or high-pressure lamps. During the operation thereof, a relatively large proportion of electrical energy is converted into heat, which may be problematic for surrounding devices or components. In this case, in order to generate light of a specific colour locus on the international standard CIE (International Commission on Illumination) chromaticity diagram, use is generally made of optical filters in order to eliminate undesirable colour components to the greatest possible extent. However, this reduces the efficiency of the respective light source.

As an alternative, there are light sources which use light-emitting diodes (LEDs), which have for example the advantage of a long service life, a fast response and also a relatively high electrical efficiency. Moreover, polychromatic light of a specific colour locus can be generated by combining LEDs of different colours. Colour filter are not absolutely necessary in this case.

A light source for the backlighting of an LCD display, said light source having LEDs with different emission spectra, is described in U.S. Pat. No. 6,540,377 for example, in which red-, green- and blue-emitting LEDs are arranged in a manner intermixed with one another on a common plane. During operation of the light source, the electromagnetic radiation of the LEDs is radiated in a common light cone and intermixed by means of diffusor material.

One disadvantage of such a light source is that the light intensity that it radiates per solid angle is limited by the maximum emission intensity of the LEDs, as a result of which its applicability is restricted. Moreover, it is necessary to provide for sufficient intermixing of the electromagnetic radiation emitted by different LEDs if homogeneous light is desired.

SUMMARY OF THE INVENTION

One object of the present invention is to provide a light source based on semiconductor chips emitting visible electromagnetic radiation which has a high light intensity radiated per solid angle, which light intensity is not limited by the maximum emission intensity of the semiconductor chips.

Another object of the invention is to enable electromagnetic radiation from semiconductor chips with different emission spectra to be intermixed simply and effectively with one another.

These and other objects are attained in accordance with one aspect of the present invention directed to a light source comprising a plurality of semiconductor chips and at least two different electromagnetic-radiation-emitting chip types having different emission spectra, each of the semiconductor chips having a chip coupling-out area through which the electromagnetic radiation is coupled out. A plurality of primary optical elements is provided, each of the semiconductor chips having a respective one of the primary optical elements corresponding thereto Each primary optical element has a light input and a light output, and reduces the divergence of at least part of the electromagnetic radiation emitted by the semiconductor chip during operation thereof. The semiconductor chips with the respectively corresponding primary optical elements are arranged in at least two groups that are spatially separate from one another, such that the groups emit separate light cones during operation of the semiconductor chips, and a secondary optical arrangement is provided, wherein the separate light cones of the groups are superposed by means of the secondary optical arrangement to form a common light cone.

Here and below the term light cone in each case means an arbitrarily shaped volume which is transilluminated by light from the light source, excluding regions in which the brightness is more than one order of magnitude lower than the maximum brightness given the same distance from the light source.

The superposition of separate light cones of different groups of semiconductor chips results in additive intermixing of radiation from different semiconductor chips. Improved mixing of the radiation from semiconductor chips with different emission spectra can thereby be achieved in a technically simple manner. Furthermore, the light intensity radiated per solid angle can be significantly increased by the superposition of separate light cones independently of the maximum light intensity of individual semiconductor chips.

In one embodiment, the separate light cones of the groups are superposed by means of the secondary optical arrangement to form a common light cone with a colour locus that is uniform to the greatest possible extent. In this case, the colour locus of the common light cone lies in the white region of the CIE chromaticity diagram.

At least one of the groups has semiconductor chips of only one chip type.

In addition or as an alternative, the semiconductor chips of a chip type are in each case contained only in one of the groups. This is useful when it is desirable to radiate light that is homogeneous to the greatest possible extent with a uniform colour locus.

In one embodiment, the plurality of semiconductor chips has a first, a second and a third chip type, the emission spectra of which are such that white light can be generated by superposition of the radiation emitted by semiconductor chips of different chip types.

In this case, the first chip type emits green radiation, the second chip type emits red radiation and the third chip type emits blue radiation, i.e. the respective emission spectrum of semiconductor chips of a chip type has radiation having wavelengths lying primarily in the green, red and blue region, respectively.

The semiconductor chips of the first chip type can be arranged in a first group and the semiconductor chips of the second and third chip types are arranged in a second group, the semiconductor chips of different chip types of the second group being arranged in a manner uniformly intermixed with one another.

As an alternative, the semiconductor chips of a chip type are arranged in each case in a group of their own and the groups are arranged in a manner spatially separate from one another, that is to say such that they do not overlap.

The secondary optical arrangement, by means of which the separate light cones are superposed, has at least one selectively reflective unit. The latter is transmissive to the radiation of at least one separate light cone and reflective to the radiation of a further separate light cone. At least two separate light cones are superposed by means of the selectively reflective unit.

The selectively reflective unit contains a dichroic layer system.

In a particular embodiment, the secondary optical arrangement has at least one combining cube based on at least one selectively reflective unit. The combining cube has at least two light inputs, into each of which a light cone is incident. The light cones radiated into the combining cube are superposed in the interior thereof by means of the selectively reflective unit and emitted jointly from a light output of the combining cube. The incident light cone may in each case be an original separate light cone originating directly from a group of semiconductor chips or a light cone in which a plurality of such separate light cones have already been superposed.

In one embodiment, an aperture angle of a separate light cone is between 0 and 60°, preferably between 0 and 40°, particularly preferably between 0 and 20°, the limits being included in each case. As explained above, the expression light cone in this context does not relate to the shape of a cone in the mathematical sense and may accordingly have more than one aperture angle. If this is the case, then the above statement relates to the maximum aperture angle.

The fact that the divergence of the separate light cones is limited to such an extent by the primary optical elements makes it possible to achieve a higher luminance or light intensity radiated per solid angle of the light source.

In particular in order to realize such a small aperture angle of a light cone emitted by the primary optical element, the light output of the primary optical element in one embodiment has a light input area or a light input opening, the size of which is less than or equal to twice the chip coupling-out area. Particularly preferably, the size of the light input area or of the light input opening is at most 1.5 times as large, in particular at most 1.1 times or 1.05 times as large as the chip coupling-out area.

The size of the light input area or of the light input opening is preferably greater or not significantly less than the chip coupling-out area.

The light input of the primary optical element that is thus provided is not only suitable for a great reduction of the divergence of a light cone, but also enables a significant miniaturization of the primary optical element and thus production of a compact light source with a high emitted luminance.

Preferably, the primary optical elements of at least one group are at least partly arranged in such a way that their light outputs are densely packed. They preferably adjoin one another without any gaps. As a result, it is possible to achieve a higher luminance and better homogeneity of a separate light cone and thus also of the common light cone.

In one embodiment, the semiconductor chips of all the groups are essentially arranged in a common plane. This may significantly simplify mounting of the semiconductor chips.

In one embodiment, the semiconductor chips with the primary optical elements are arranged in matrix-like fashion, i.e. regularly in rows and columns, at least partly or at least in partial groups.

In one embodiment of the light source, the primary optical element is in each case an optical concentrator which is arranged with respect to the light source in such a way that its actual concentrator output is now the light input. Compared with the customary application of a concentrator (to which the term "actual" concentrator output used above relates), in the present case light from the semiconductor chips passes through the concentrator in the opposite direction. Consequently, this light is not concentrated, but rather leaves the concentrator with reduced divergence through the actual light input, now used as a light output. Once again, "actual" relates to the actual utilization as a concentrator.

The concentrator is particularly preferably a CPC-, CEC- or CHC-like concentrator, which means, here and below, a concentrator whose reflective side walls at least partly and/or at least to the greatest possible extent have the form of a compound parabolic concentrator (CPC) a compound elliptic concentrator (CEC) and/or a compound hyperbolic concentrator (CHC). Primary optical elements configured in this way enable an efficient reduction of the divergence of light, as a result of which the light intensity radiated per solid angle can be increased.

As an alternative to the CPC-, CEC- or CHC-like concentrator, the concentrator has side walls which connect the light input to the light output and along which direct connecting lines run essentially straight between the light input and the light output. The side walls have, instead of side walls curved in paraboloid, ellipsoid or hyperboloid-like fashion, side walls that essentially run straight, so that the primary optical element has for example a basic form of a frustum of a pyramid or a frustum of a cone.

The concentrator can have a cross-sectional area in the form of a regular polygon, such as a square cross-sectional area, in a region on the side of the light input. It likewise can have a cross-sectional area in the form of a regular polygon, such as a triangular, quadrangular, hexagonal or octagonal cross-sectional area, in a region on the side of the light output. The cross-sectional area undergoes transition from one form to the other between these regions. The light input of the concentrator can thus be adapted to the customary form of semiconductor chips and the light output can be configured for example in such a way that the light outputs of a plurality of primary optical elements can be arranged regularly with respect to one another and without any gaps. The use of such primary optical elements makes it possible to arrange the semiconductor chips at a relatively large distance from one another without the light cone radiated by this arrangement appearing to be illuminated with gaps. The distance between the semiconductor chips means that the heat generated by them can be dissipated better.

In one embodiment, the concentrator has a basic body defining a cavity, the inner wall of which basic body is reflective to a light emitted by the semiconductor chip, and/or the inner wall of which basic body is essentially provided with a layer or layer sequence, preferably with a metallic layer, which is reflective to a light emitted by the semiconductor chip.

As an alternative, the concentrator is a dielectric concentrator, the basic body of which is a solid body composed of a dielectric material with a suitable refractive index, so that light coupled in via the light input is reflected in it by total reflection at the lateral interface—connecting the light input to the light output—of the solid body to the surrounding medium. This has the effect that there are to the greatest possible extent no light losses on account of reflections in the concentrator.

In one embodiment, the dielectric concentrator has, as the light output, a surface, which is curved in a lens-like fashion and may be curved e.g. spherically or aspherically. As a result, it is possible to obtain a further reduction of the divergence of a light cone. The light output is preferably curved like an aspherical lens, as a result of which it is possible to take account for instance of the size of the chip coupling-out area. Spherical lenses are optimal for point light sources and, in the case of non-point light sources, may have significantly poorer properties with regard to a reduction of the divergence of a light cone.

In a further embodiment, the dielectric concentrator is advantageously at least partly provided with a layer or layer sequence, preferably with a metallic layer, which is reflective to light emitted by the respective semiconductor chip. This may be useful e.g. if the semiconductor chip is incorporated in the material of the concentrator, in order to prevent the radiation which does not meet the condition of total reflection in a first part of the concentrator from being laterally coupled out of the concentrator.

The concentrator can be arranged downstream of the semiconductor chip in the main radiating direction thereof, and there is a gap between the chip coupling-out area and the light input of the concentrator. The said gap is free of solid or viscous material to the greatest possible extent.

What is thereby achieved is that, in particular, beams which are emitted at a particularly large angle with respect to the main radiating direction of a semiconductor chip and would expand a separate light cone to an excessively great extent do not impinge on the light input, but rather pass by the latter laterally and are not even coupled into the concentrator at all. In the case of a dielectric concentrator, the gap has the effect that the proportion of beams reflected at the interface of the light input is larger, the larger the angle of incidence of said beams on the light input. Consequently, the highly divergent proportion of the light that passes into the concentrator is attenuated in each case.

in this context, the primary optical element can be assigned one or more reflector elements, which are arranged and/or are of a form such that some of the light beams which do not pass directly from the semiconductor chip into the concentrator are multiply reflected at said reflector elements and directed onto the light input of the concentrator at a smaller angle with respect to the main radiating direction of the semiconductor chip. This leads to the increase in the intensity of the light passing into the concentrator.

The basic body of the concentrator expediently comprises a transparent glass, a transparent crystal or a transparent plastic. In the latter case, the concentrator is preferably produced in a transfer moulding method and/or an injection moulding method.

The material of the basic body is resistant to a radiation emitted by the semiconductor chip, in particular to an electromagnet radiation from the blue or UV spectral region. For this purpose, the material has e.g. silicone or comprises the latter.

In one embodiment, the semiconductor chip is an electromagnetic-radiation-emitting diode, preferably an electromagnetic-radiation-emitting diode with a radiating characteristic which complies at least approximately with Lambert's law, preferably a thin-film light-emitting diode chip.

A thin-film light-emitting diode chip is distinguished in particular by the following characteristic features:

a reflective layer is applied or formed at a first main area—facing toward a carrier element—of a radiation-generating epitaxial layer sequence, which reflective layer reflects at least part of the electromagnetic radiation generated in the epitaxial layer sequence back into the latter;

the epitaxial layer sequence has a thickness in the region of 20 µm or less, in particular in the region of 10 µm; and the epitaxial layer sequence contains at least one semiconductor layer with at least one area which has an intermixing structure which ideally leads to an approximately ergodic distribution of the light in the epitaxial layer sequence, i.e. it has an as far as possible ergodically stochastic scattering behaviour.

A basic principle of a thin-film light-emitting diode chip is described for example in I. Schnitzer et al., Appl. Phys. Lett. 63 (16), 18 Oct. 1993, 2174-2176, the disclosure content of which is in this respect hereby incorporated by reference.

A thin-film light-emitting diode chip is to a good approximation a Lambert surface radiator and is therefore particularly well suited to application in a directional light source.

In one embodiment of the light source, the semiconductor chips are arranged on a respective carrier on which they are surrounded in each case by a frame. The primary optical element is fitted at or in the frame, It is held by the said frame and/or adjusted by the said frame relative to the chip coupling-out area.

At least parts or a part of the carriers and/or in each case the carrier and the frame are formed in one part with one another.

In a further embodiment of the light source, the inner area of the frame and/or free areas of that surface of the carrier which faces toward the radiating direction of the semiconductor chip is or are reflective to radiation emitted by the respective semiconductor chip. In addition or as an alternative, the inner area and/or free areas is or are at least partly provided with a layer or layer sequence, preferably with a metallic layer, which is reflective to radiation emitted by the respective semiconductor chip.

In one embodiment, a plurality of primary optical elements are formed in one part with one another. This may significantly simplify both production of the primary optical elements and mounting thereof in a light source, which may lead for example to lower production costs.

DETAILED DESCRIPTION OF THE DRAWINGS

In the exemplary embodiments and figures, identical or identically acting constituent parts are in each case provided with the same reference symbols.

Figure 1:
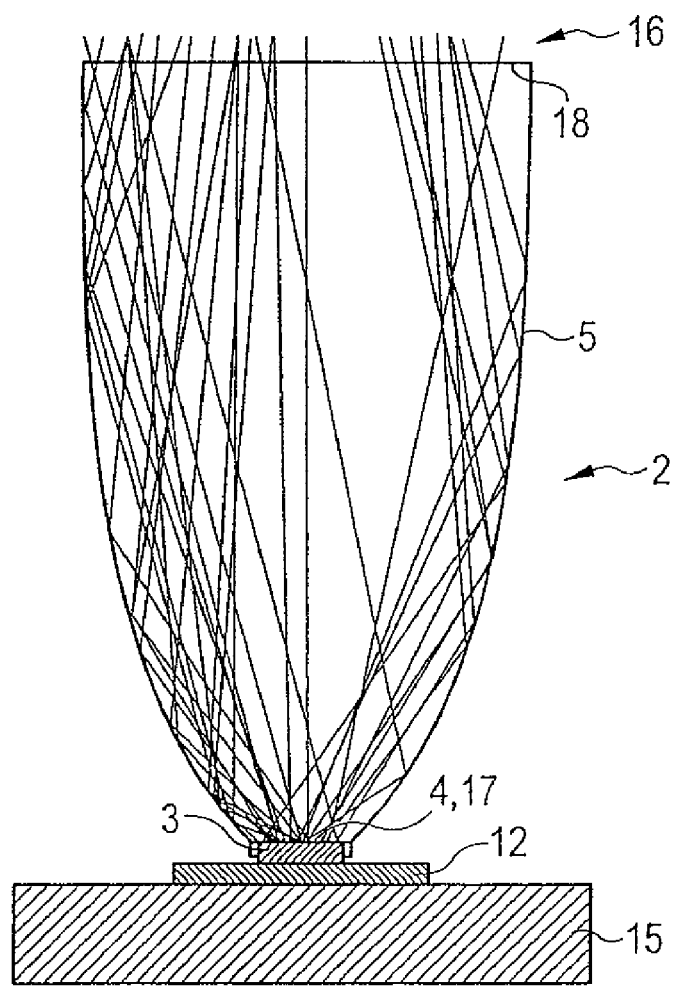
FIG. 1 shows a diagrammatic illustration of a section through a semiconductor chip with a primary optical element of a light source according to the invention.

In the case of the arrangement shown in FIG. 1 with a semiconductor chip 3 and a primary optical element 5, called chip primary optical element 2 hereinafter for short, a semiconductor chip 3 is applied on a first carrier 12. The primary optical element 5 is arranged downstream of the semiconductor chip 3 in the main radiating direction thereof. The first carrier 12 is in turn applied on a second carrier 15, which serves as a heat sink for the heat generated by the semiconductor chip 3 during the operation thereof.

The first carrier 12 is for example a printed circuit board (PCB), the possible construction and possible materials of which are known to a person with ordinary skill in the art and, therefore, are not explained in any greater detail at this point. The second carrier 15 is composed of copper, for example.

The semiconductor chip 3 is e.g. a thin-film light-emitting diode chip which may be configured in the manner described above.

Furthermore, the epitaxial layer sequence may be based on at least one material of the system $In_xAl_yGa_{1-x-y}N$ or $In_xGa_yAl_{1-x-y}P$ where $0 \leq x \leq 1$, $0 \leq y \leq 1$ and $x+y \leq 1$. It has a chip coupling-out area 4 directly adjoining the light input 17 of the primary optical element 5.

The primary optical element 5 is a three-dimensional, CPC-like concentrator, the light input 17 and light output 18 of which are circular. Light, in the form of visible electromagnetic radiation, passes through the light input 17 from the semiconductor chip 3 into the primary optical element 5. The radiation is reflected at the walls connecting the light input 17 to the light output 18 in such a way that the divergence of the light is significantly reduced (indicated by the lines 16). The light cone radiated from the light output 18 has for example an aperture angle of less than 20°, e.g. approximately 9°, whereas the semiconductor chip approximately has a radiating characteristic that complies with Lambert's law.

The basic body of the primary optical element 5 functions like a hollow body, the inner wall of which is provided with a material that is reflective to a light emitted by the semiconductor chip. This may be for example a metallic layer composed of Al, for instance. The material from which the basic body is essentially produced may be a plastic such as polycarbonate, for instance; by way of example, the basic body may be produced from such a material by means of injection moulding.

Figure 2:
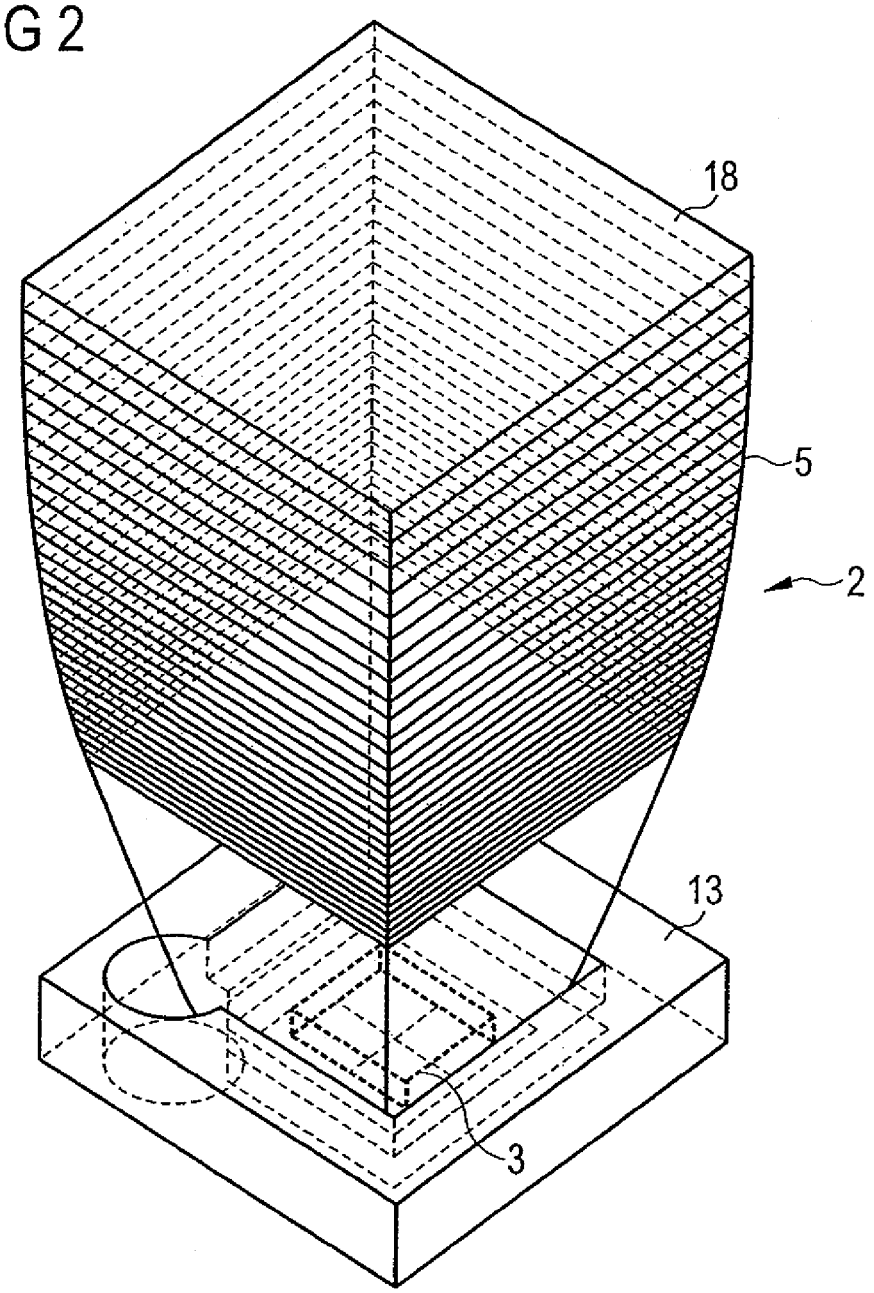
FIG. 2 shows a diagrammatic perspective illustration of an arrangement with a semiconductor chip and a primary optical element of a further light source according to the invention.

As shown in FIG. 2, the semiconductor chip 3 may additionally be surrounded by a frame 13, by which the primary optical element 5 may be held and/or adjusted relative to the semiconductor chip 3. The frame is e.g. partly filled with a potting compound.

In the case of the arrangement shown in FIG. 2 with a semiconductor chip 3 and a primary optical element 5, the CPC-like concentrator has, in contrast to the example explained with reference to FIG. 1, perpendicular to the main radiating direction thereof, a cross section with a square form, so that, in particular, the light input (not shown) and light output 18 thereof are also square. Consequently, the form of the primary optical element 5 is adapted to the form of the chip coupling-out area of the semiconductor chip 3. This additionally has the advantage, in particular, that the light outputs of a plurality of such elements 2 can be arranged without any gaps in an arbitrarily sized area.

Figure 3A:
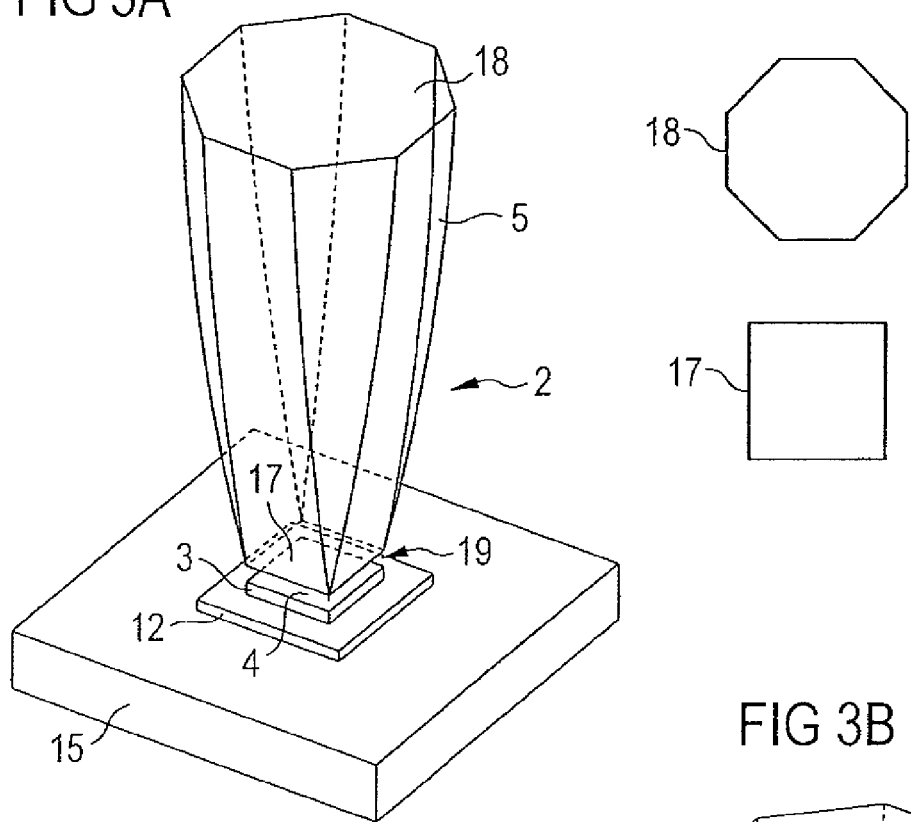
FIG. 3a shows a diagrammatic perspective illustration of an arrangement with a semiconductor chip and a primary optical element of yet another light source according to the invention.
Figure 3B:
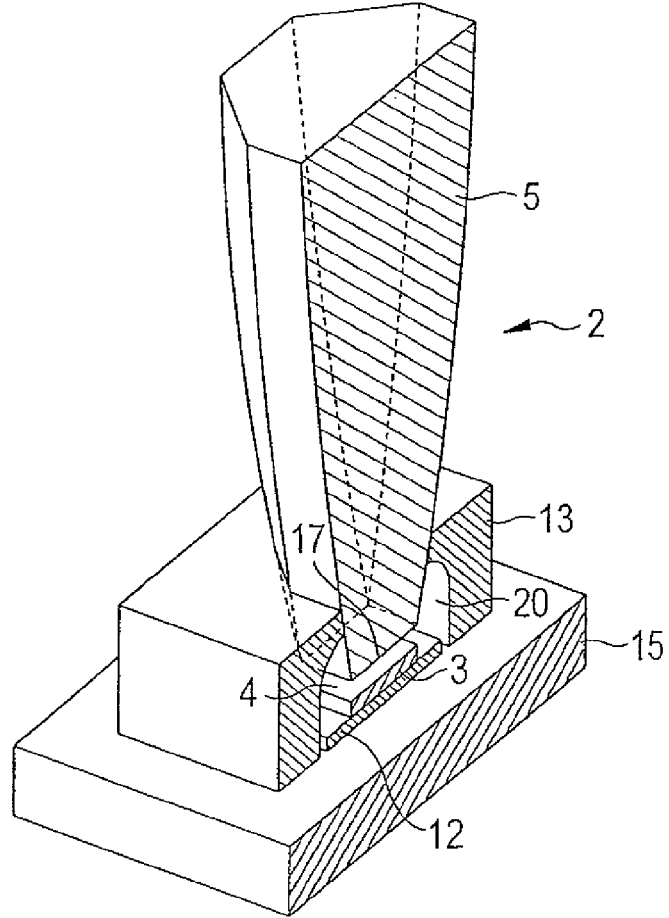
FIG. 3b shows a diagrammatic perspective illustration of a section through the arrangement with a semiconductor chip and a primary optical element from FIG. 3a, which is additionally assigned a frame.

In the arrangement in accordance with FIGS. 3a and 3b, the primary optical element 5 is a dielectric CPC-like concentrator, the basic body of which comprises for example a transparent plastic, for example polycarbonate.

The light input 17 has a square form, while the light output 18 has the form of a regular octagon (shown on the right beside the primary optical element 5 in each case in plan view). In between, the cross-sectional form of the primary optical element 5 undergoes transition from the square to the octagonal form.

There is an air gap 19 between the chip coupling-out area 4 of the semiconductor chip 3 and the light input 17. The highly divergent proportion of the light that passes into the primary optical element 5 is thereby attenuated in accordance with the mode of action already explained further above in the general part of the description.

A frame 13 of the chip primary optical element 2 is shown in FIG. 3b in supplementary fashion to FIG. 3a. The inner wall 20 of this frame 13 and also the front side of the first carrier 12 are formed in reflective fashion, so that at least part of the radiation which does not pass directly into the primary optical element 5 is multiply reflected at them in such a way that it is then directed onto the light input 17 of the primary optical element 5 at a smaller angle with respect to the axis of the said primary optical element 5. In this case, the frame 13 may be formed in one part with the first carrier 12, which, of course, does not preclude a multipartite embodiment possibly with constituents made of different materials.

As an alternative, the semiconductor chip 3 may also be embedded in the material of the primary optical element 5 or the chip coupling-out area thereof may have physical contact with the light input 17.

At least part of the side area—connecting the light input 17 to the light output 18—of the basic body of the primary optical element 5 may be provided with a reflective layer (e.g. Al) in such a way that light beams which are coupled into the light input 17 and do not meet the condition of total reflection at the side are nevertheless reflected at the latter to the greatest possible extent. This may be expedient particularly in the case of that part of the side area which adjoins the light input 17 and is thus closest to the semiconductor chip 3.

Figure 6:
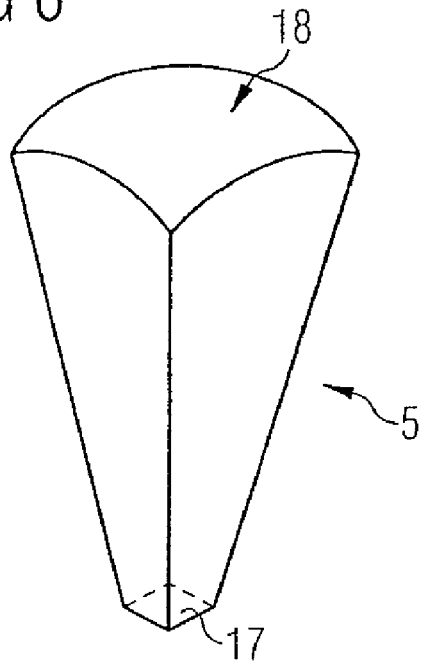
FIG. 6 shows a diagrammatic three-dimensional view of a further exemplary embodiment of a primary optical element.

In contrast to the primary optical elements illustrated in FIGS. 1 to 3b, the primary optical element 5 illustrated in FIG. 6 has side walls which run in straight lines from the light input 17 to the light output 18. The primary optical element 5 is a dielectric concentrator having a frustoconical basic form, the light output 18 not being planar, but rather being curved outwards like an aspherical lens. Compared with a spherical curvature, the curvature decreases for example with increasing distance from the optical axis of the primary optical element, in order to take account of the fact that the light cone whose divergence is to be reduced by the primary optical element is not a point light source but rather a light source having a certain extent.

Compared with the primary optical elements 5 illustrated in FIGS. 1 to 3b, a primary optical element such as that illustrated in FIG. 6 has the advantage that it can achieve a comparable reduction of the divergence of a light cone in conjunction with a significant reduction of the structural height of the primary optical element 5. A further advantage of the primary optical element illustrated in FIG. 6 is that, on account of its straight side areas, it can be produced more simply by means of an injection method such as, by way of example, injection moulding or transfer moulding.

The light input has e.g. a light input area which is approximately as large as a chip coupling-out area of a semiconductor chip that is to be used with the primary optical element. As a result, it is possible to achieve a particularly good utilization of the divergence-reducing properties of the primary optical element. Particularly preferably, the light input area is at most 1.5 times as large as the chip coupling-out area.

It is also possible to use the primary optical element e.g. with a semiconductor chip whose chip coupling-out area is larger than the light input area, which, however, may lead to a somewhat lower effectiveness with regard to emitted light intensity and luminance. Simulations have revealed in an example that, for the case of a somewhat larger chip coupling-out area, approximately 10% less light intensity can be radiated in a solid angle of 15° than in the case of a chip coupling-out area which is somewhat smaller than the light input area.

Figure 7:
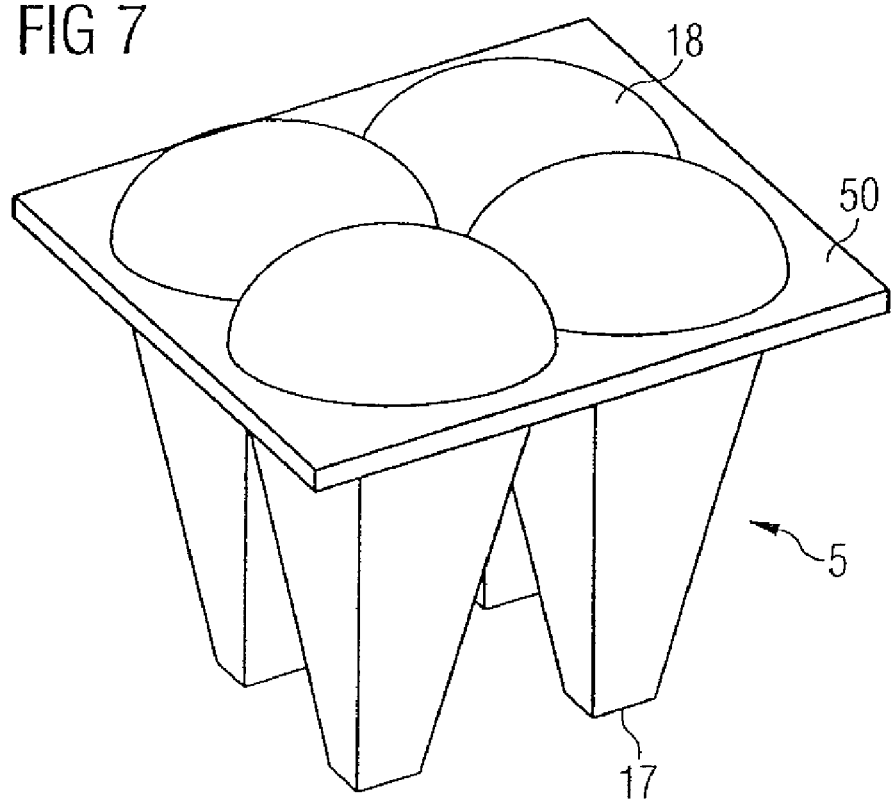
FIG. 7 shows a diagrammatic three-dimensional view of an exemplary embodiment of primary optical elements that are formed in one part with one another.

By means of an injection method, in particular, it is possible to form a plurality of primary optical elements in one part with one another, as illustrated as an example in FIG. 7. In this exemplary embodiment, the primary optical elements 5 are connected to one another by a carrier plate 50, the carrier plate being arranged near the light output 18, so that frusto-pyramidal parts of the primary optical elements 5 proceed from one side of the carrier plate 50 and lenticular elements are formed on the other side, the outer area of which in each case forms the light output 18 of the primary optical elements 5.

As an alternative to the exemplary embodiments for primary optical elements 5 as explained with reference to FIGS. 6 and 7, instead of having a pyramidal basic form, said primary optical elements may also have for example a frusto-conical basic form or a basic form having a rectangular cross section. It is likewise conceivable for the square cross section of the primary optical elements in FIGS. 6 and 7 to undergo transition, towards the light output 18, into a cross-sectional form having more than four corners, analogously to the exemplary embodiment described above with reference to FIGS. 3a and 3b.

Figure 8A:
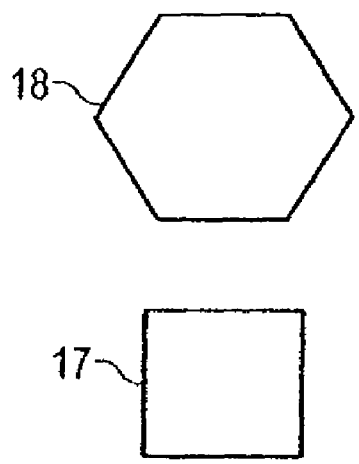
FIG. 8a is plan view of a square light input area and a hexagonal light output area of an optical element.
Figure 8B:
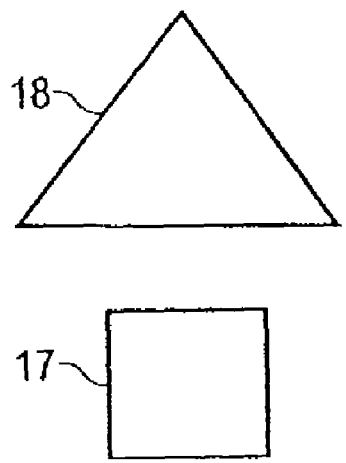
FIG. 8b is plan view of a square light input area and a triangular light output area of an optical element.

As an alternative to the exemplary embodiments for primary optical elements 5 as explained with reference to FIGS. 1, 2, 3a, 3b, 6, and 7, the primary optical element 5 can have a cross-sectional area in the form of a regular polygon, such as a square cross-sectional area, in a region on the side of the light input 17, and have a cross-sectional area in the form of a regular polygon, such as a hexagonal (see FIG. 8a), triangular (see FIG. 8b), or quadrangular cross-sectional area, in a region on the side of the light output 18. The cross-sectional area undergoes transition from one form to the other between these regions.

It is furthermore possible for the primary optical element to be configured in such a way that a divergence of electromagnet radiation in different planes running parallel to a main radiating direction of the primary optical element is reduced to different extents. By way of example, the aperture angle of an emitted light cone has a magnitude of approximately 70 in one plane and approximately 100 in a plane perpendicular to said plane (sectional area along a main radiating line).

It is equally possible for CPC-, CEC- or CHC-like dielectric concentrators, for further reduction of the divergence of a light cone, likewise to have a lenticularly curved light output. As an alternative to a dielectric concentrator, the concentrator may also comprise a hollow body with reflective inner walls, a lens being arranged downstream of the light output thereof in the radiating direction of the concentrator. By way of example, the lens is placed onto the light output.

Figure 4A:
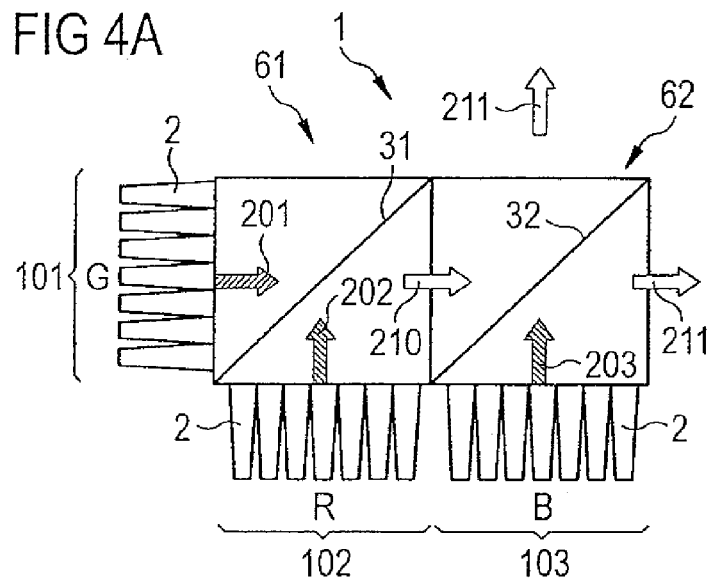
FIGS. 4a to 4c show diagrammatic illustrations of plan views of a first, second and third exemplary embodiment of a light source.

In the case of the exemplary embodiment of a light source as shown in FIG. 4a, a plurality of chip primary optical elements 2 are arranged in three groups 101, 102, 103 that are spatially separate from one another.

The chip primary optical elements 2 may be produced for example in accordance with one or more of the examples described above in conjunction with FIGS. 1 to 3b.

They are arranged in matrix-like fashion in each group 101, 102, 103 and the light outputs of the primary optical elements 5 adjoin one another to the greatest possible extent without any gaps. In this way, a light cone that is homogeneous to the greatest possible extent can be emitted even though relatively large distances are possible between the semiconductor chips, which is advantageous with regard to dissipating the heat generated by the semiconductor chips during the operation thereof.

Each of the groups 101, 102, 103 has in each case semiconductor chips of only one chip type. The first group 101 emits green light, the second group 102 emits red light and the third group 103 emits blue light, as is respectively symbolized by the letters G, R or B. A separate light cone is in each case emitted by each of the groups 101, 102, 103, as is respectively indicated by arrows 201, 202, 203.

The separate light cones 201, 202, 203 are superposed to form a common light cone 211 by means of two selectively reflective units 31, 32. In this case, first of all the second separate light cone 202 is brought into the beam path of the first separate light cone 201 by means of the first selectively reflective unit 31. The first selectively reflective unit 31 is transmissive to the green light of the first separate light cone 201 and reflective to the red light of the second separate light cone 202, with the result that the two separate light cones are superposed to form an intermediate light cone 210.

In an analogous manner, the third separate light cone 203 is superposed with the intermediate light cone 210 to form a common light cone 211 by means of the second selectively reflective unit 32. In this case, the second selectively reflective unit 32 may either be transmissive to the light of the intermediate light cone 210 and reflective to the light of the third separate light cone 203, or vice versa, so that two different light outputs are possible for the light source 1.

The common light cone 211 radiates light that is homogeneous to the greatest possible extent with a colour locus in the CIE chromaticity diagram that is uniform to the greatest possible extent. In this case, the colour locus can be controlled by the light intensity respectively emitted by the groups, i.e. by the magnitude of the operating voltage applied to the semiconductor chips of different groups 101, 102, 103. In particular, it is thus possible to generate white light, but in the same way also any arbitrary other mixed colour comprising the colours of the light of the three separate light cones 201, 202, 203.

The selectively reflective units 31, 32 are e.g. dichroic layer systems, i.e. selectively reflective units which substantially reflect part of the spectrum and are transmissive to the greatest possible extent in the remaining spectral range. They have a plurality of layers of materials having different high and low refractive indices, which may be applied to film substrates e.g. by means of sputtering.

The selectively reflective units are in each case integrated in a combining cube 61, 62, the light output of the first combining cube 61 directly adjoining a light input of the second combining cube 62. In addition to the selectively reflective units, the combining cube may also be composed of a suitable light-transmissive material, e.g. a transparent plastic such as polycarbonate. As an alternative, the combining cube may also be omitted, so that the secondary optical arrangement essentially comprises the selectively reflective units and, if appropriate, associated carrier systems.

Figure 4B:
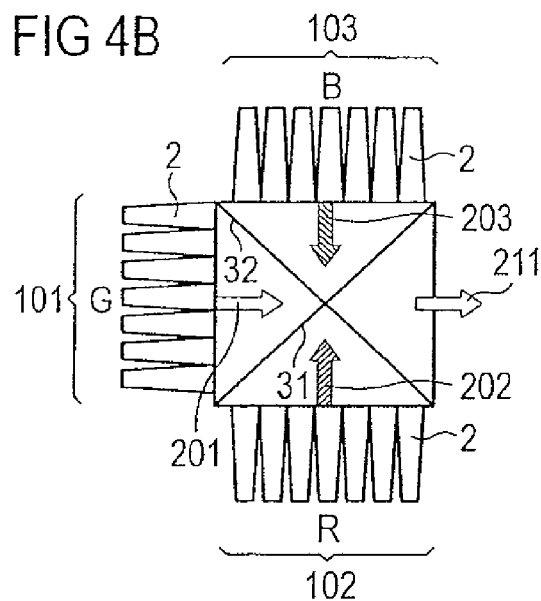

In contrast to the exemplary embodiment described with reference to FIG. 4a, the light source shown in FIG. 4b has a combining cube with three light inputs and a light output into which two selectively reflective units 31, 32 are integrated. The separate light cones 201, 202, 203 are superposed by means of the selectively reflective units 31, 32 according to the same technical principle as explained above.

Figure 4C:
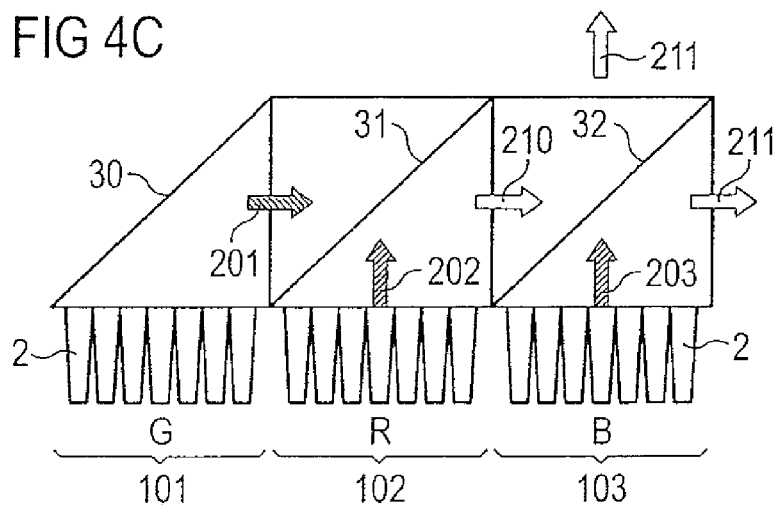

In the case of the light source illustrated in FIG. 4c, in contrast to the abovementioned exemplary embodiments, all the chip primary optical elements 2 are arranged in a common plane, for example on a common carrier (not shown). The mounting thereof can thereby be significantly simplified. In this case, the first separate light cone 201 is brought into the desired beam path by means of a mirror, e.g. a metallic mirror. The first selectively reflective unit 31 is transmissive to green light of the group 101 and reflects red light of the group 102. The second selectively reflective unit 32 is transmissive to green and red light of the group 101 and 102, respectively, and reflective to blue light of the group 102.

Figure 5A:
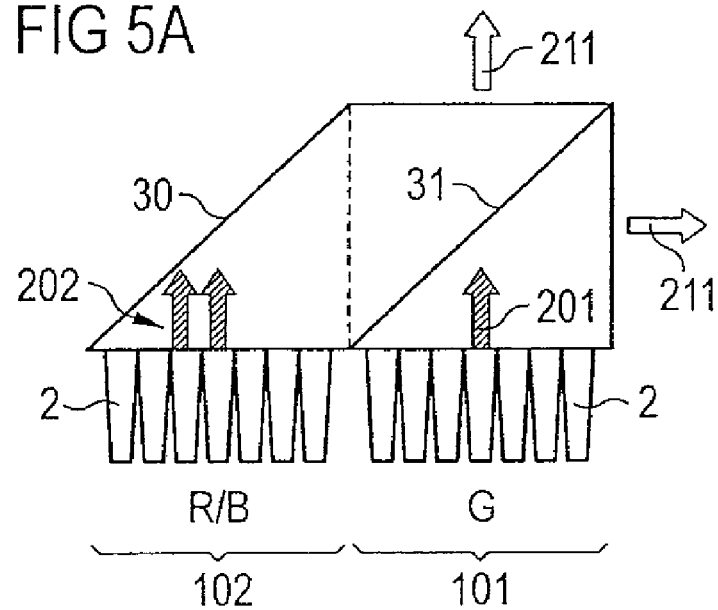
FIGS. 5a and 5b show diagrammatic illustrations of plan views of a fourth and fifth exemplary embodiment of a light source.
Figure 5B:
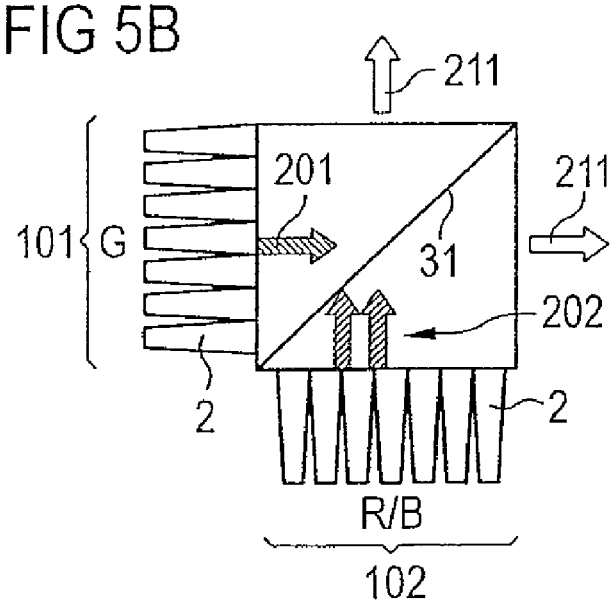

FIGS. 5a and 5b show light sources in which the chip primary optical elements 2 are arranged in a total of two groups 101, 102 that are spatially separate from one another. In this case, the first group 101 has only semiconductor chips of a chip type which emits green light, symbolized by the letter G. By contrast, the second group 102 has semiconductor chips of a second and a third chip type, the second chip type emitting red light and the third emitting blue light, symbolized by the letter combination R/B.

The semiconductor chips of different chip types of the second group 102 are arranged in a manner uniformly intermixed with one another, so that the radiation thereof is at least partly already intermixed in the separate light cones 102 thereof.

If white light is to be generated from saturated green, red and blue light, then the total light intensity requires approximately 65% of green light, approximately 28% of red light and approximately 7% of blue light. Moreover, if typical values of the light intensity of corresponding varicoloured light-emitting diode chips are taken into account, then more than 50% of green-emitting semiconductor chips is required.

The number of semiconductor chips of different chip types in the light sources shown in FIGS. 5a and 5b corresponds to this distribution. Accordingly, these light sources can be used to generate white light, for example if the semiconductor chips are all operated approximately with their maximum power. This may also be the case in the exemplary embodiments explained with reference to FIGS. 4a to 4c if the number of semiconductor chips of the respective chip type is correspondingly adapted.

The light source is suitable in particular for projection systems, for example for projecting variable images, since it can for example illuminate the corners of a typically rectangular or square cross section better than conventional light sources, which, moreover, generally require the use of additional diaphragms.

The above explanation of the invention on the basis of the exemplary embodiments is not to be understood as a restriction of the invention thereto. Thus, it also for instance accords with the essence of the invention if a plurality of semiconductor chips are assigned to a primary optical element. The invention also encompasses the possibility of the light source having at least one condenser lens by means of which the divergence of the common light cone or of one or more separate-light cones is reduced. It equally encompasses arranging a further optical element downstream of each semiconductor chip in the radiating direction in addition to the primary optical element, for example for the purpose of reducing the divergence of a radiation emitted by the semiconductor chip. It should be noted that an essential aspect of the invention is based on the use of a concentrator in the opposite direction in order to reduce the divergence of the radiation of light-emitting diode chips (i.e. light enters through the exit of the concentrators, such that light is not concentrated but its divergence is reduced).

The light source is suitable, as mentioned above, preferably for the use of visible-light-emitting semiconductor chips. However, the use of infrared- or UV-emitting semiconductor chips is also conceivable, in principle. In these cases, visible radiation is generated by means of luminescent materials, which is then superposed to form the desired light cones by means of selectively reflective units.

As an alternative to the selectively reflective units, other devices, such as prisms, for instance, may also be used for superposing the separate light cones.

Moreover, the invention encompasses any new feature and any combination of features of the exemplary embodiments and of the claims, even if such combinations are not explicitly specified in the claims or exemplary embodiments.

What is claimed is:

1. A light source comprising:
   a plurality of semiconductor chips and at least two different electromagnetic-radiation-emitting chip types having different emission spectra, each of said semiconductor chips having a chip coupling-out area through which the electromagnetic radiation is coupled out;
   a plurality of primary optical elements, each of said semiconductor chips having a respective one of said primary optical elements corresponding thereto, which has a light input and a light output and reduces the divergence of at least part of the electromagnetic radiation emitted by the semiconductor chip during operation thereof, wherein the semiconductor chips with the respectively corresponding primary optical elements are arranged in at least two groups that are spatially separated from one another, such that the groups emit separate light cones during operation of the semiconductor chips, and
   a secondary optical arrangement, wherein said secondary optical arrangement superposes the separate light cones of the groups to form a common light cone, and
   wherein the light input has a light input area or a light input opening, which has a size that is less than or equal to two times the chip coupling-out area.

2. The light source according to claim 1, wherein the light input has a light input area or a light input opening, the size of which is less than or equal to 1.5 times the chip coupling-out area.

3. The light source according to claim 1, wherein each of the plurality of primary optical elements is an optical concentrator, the light input being the actual concentrator output, so that light passes through the concentrator in the opposite direction compared with the customary application of a concentrator for focusing and is thus not concentrated, but rather leaves the concentrator with reduced divergence through the light output.

4. The light source according to claim 3, wherein the optical concentrator has reflective sidewalls which at least partly have the form of at least one of a compound parabolic concentrator CPC a compound elliptic concentrator (CEC) and a compound hyperbolic concentrator (CH-C).

5. The light source according to claim 3, wherein the optical concentrator has side walls which connect the light input to the light output and are formed in such a way that direct connecting lines running on the side walls essentially run straight between the light input and the light output.

6. The light source according to claim 3, wherein the optical concentrator is a dielectric concentrator, a basic body of which is a solid body composed of a dielectric material with a suitable refractive index, so that light coupled in via the light input is reflected in basic body by total reflection at the lateral interface, coupling the light input to the light output, of the solid body to the surrounding medium.

7. The light source according to claim 6, wherein the light output is surface of the solid body which is curved as a lens.

8. The light source according to claim 7, wherein the light output has a curvature which compared with a spherical curvature decreases with increasing distance from an optical axis of the optical concentrator.

9. The light source according to claim 3, wherein the optical concentrator is arranged downstream of the semiconductor chip in the main radiating direction thereof, and in that there is a gap between the chip coupling-out area and the light input of the optical concentrator.

10. The light source according to claim 9, wherein the gap is substantially free of solid or viscous material.

11. The light source according to claim 1, wherein a plurality of primary optical elements are formed in one part with one another.

12. The light source according to claim 1, wherein the primary optical elements of at least one group are at least partly arranged in such a way that their light outputs adjoin one another without any gaps.

13. The light source according to claim 1, wherein an aperture angle of the separate light cones is between 0 and 40°, the limits being included.

14. The light source according to claim 1, wherein an aperture angle of the separate light cones is between 0 and 20°, the limits being included.

15. A light source comprising:
a plurality of semiconductor chips and at least two different electromagnetic-radiation-emitting chip types having different emission spectra, each of said semiconductor chips having a chip coupling-out area through which the electromagnetic radiation is coupled out;
a plurality of primary optical elements, each of said semiconductor chips having a respective one of said primary optical elements corresponding thereto, which has a light input and a light output and reduces the divergence of at least part of the electromagnetic radiation emitted by each of the semiconductor chips during operation thereof;
wherein each of the plurality of primary optical elements is an optical concentrator, the light input being the actual concentrator output, so that the light passes through the optical concentrator in the opposite direction compared with the customary application of a concentrator for focusing and is thereby not concentrated, but rather leaves the concentrator with reduced divergence through the light output;
wherein the optical concentrator has a quadrangular cross-sectional area in a region on the side of the light input, and a cross-sectional area in the form of a triangular, hexagonal, or octagonal cross-sectional area in a region on the side of the light output;
wherein the semiconductor chips with the respectively corresponding primary optical elements are arranged in two groups that are spatially separated from one another, such that the groups emit separate light cones during operation of the semiconductor chips; and
a secondary optical arrangement, wherein said secondary optical arrangement superposes the separate light cones of the groups to form a common light cone.

16. The light source according to claim 15, wherein the optical concentrator has reflective sidewalls which at least partly have the form of at least one of a compound parabolic concentrator (CPC), a compound elliptic concentrator (CEC) and a compound hyperbolic concentrator (CH-C).

17. The light source according to claim 15, wherein the optical concentrator has side walls which connect the light input to the light output and are formed in such a way that direct connecting lines running on the side walls essentially run straight between the light input and the light output.

18. The light source according to claim 15, wherein the optical concentrator is a dielectric concentrator, a basic body of which is a solid body composed of a dielectric material with a suitable refractive index, so that light coupled in via the light input is reflected in basic body by total reflection at the lateral interface, coupling the light input to the light output, of the solid body to the surrounding medium.

19. The light source according to claim 18, wherein the light output is surface of the solid body which is curved as a lens.

20. The light source according to claim 19, wherein the light output has a curvature which compared with a spherical curvature decreases with increasing distance from an optical axis of the optical concentrator.

21. The light source according to claim 15, wherein the optical concentrator is arranged downstream of the semiconductor chip in a main radiating direction thereof, and wherein there is a gap between the chip coupling-out area and the light input of the optical concentrator.

22. The light source according to claim 21, wherein the gap is substantially free of solid or viscous material.

23. The light source according to claim 15, wherein a plurality of primary optical elements are formed in one part with one another.

24. The light source according to claim 15, wherein the primary optical elements of at least one group are at least partly arranged in such a way that their light outputs adjoin one another without any gaps.

25. The light source according to claim 15, wherein an aperture angle of the separate light cones is between 0 and 40°, the limits being included.

26. The light source according to claim 15, wherein an aperture angle of the separate light cones is between 0 and 20°, the limits being included.

* * * * *